United States Patent
Shibata et al.

(10) Patent No.: US 8,377,721 B2
(45) Date of Patent: Feb. 19, 2013

(54) SUBSTRATE PROCESSING SYSTEM AND METHOD

(75) Inventors: Tsuyoshi Shibata, Koshi (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1251 days.

(21) Appl. No.: 12/141,395

(22) Filed: Jun. 18, 2008

(65) Prior Publication Data

US 2009/0014125 A1 Jan. 15, 2009

(30) Foreign Application Priority Data

Jul. 12, 2007 (JP) ................. 2007-183569

(51) Int. Cl.
*H01L 21/00* (2006.01)
*G06F 19/00* (2011.01)
*G01L 21/30* (2006.01)

(52) U.S. Cl. ................. 438/7; 438/16; 216/59; 430/30; 700/121

(58) Field of Classification Search ............. 156/345.24; 438/7, 16; 700/121; 216/59
See application file for complete search history.

(56) References Cited

U.S. PATENT DOCUMENTS

| | | | | |
|---|---|---|---|---|
| 7,867,673 B2* | 1/2011 | Ogata et al. | ...................... | 430/30 |
| 2003/0051812 A1* | 3/2003 | Sotozaki et al. | ......... | 156/345.12 |
| 2006/0262287 A1* | 11/2006 | Hiar et al. | ........................ | 355/30 |
| 2011/0220287 A1* | 9/2011 | Sawai et al. | .............. | 156/345.24 |

FOREIGN PATENT DOCUMENTS

| | | |
|---|---|---|
| JP | 2002-190446 | 7/2002 |
| JP | 2003-209093 | 7/2003 |
| JP | 2006-179726 | 7/2006 |
| JP | 2006-179727 | 7/2006 |
| JP | 2007-110078 | 4/2007 |
| WO | WO 2006/054459 | * 5/2006 |
| WO | WO 2007/032372 | * 3/2007 |

* cited by examiner

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

A substrate processing system includes a resist pattern forming apparatus including modules each configured to perform a predetermined process on a substrate with an underlying film formed thereon, an etched pattern forming apparatus including chambers each configured to perform patterning of the underlying film by use of a resist pattern as a mask, and examination devices configured to perform measurement and examination of a pattern attribute rendered on a substrate after a process in the resist pattern forming apparatus and after a process in the etched pattern forming apparatus. A controller is preset to utilize measurement results and transfer data to calculate correction value ranges respectively settable in the modules and the chambers and to determine combinations of the modules and the chambers such that corrections made within the correction value ranges cause a pattern attribute to approximate a predetermined value for each of the substrates.

15 Claims, 7 Drawing Sheets

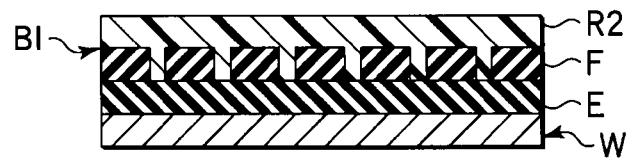
FIG.7A
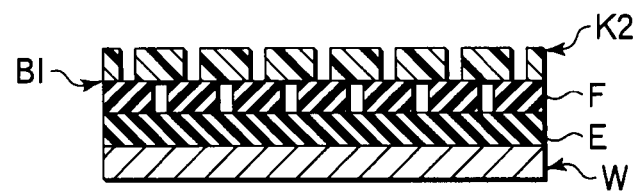
FIG.7B
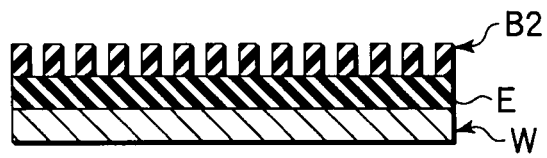
FIG.7C
|  | Md1 | Md2 | Md3 | Md4 |
|---|---|---|---|---|
| Ch1 | ○ | ○ | × | ○ |
| Ch2 | ○ | ○ | × | × |
| Ch3 | ○ | × | ○ | ○ |
FIG.8

SUBSTRATE PROCESSING SYSTEM AND METHOD

BACKGROUND OF THE INVENTION

1. Field of the Invention

The present invention relates to a substrate processing system and method for forming a predetermined pattern on a substrate by use of a photolithography technique.

2. Description of the Related Art

In the sequence of photolithography for manufacturing semiconductor devices, the following processes are sequentially performed to form a predetermined pattern on a target substrate, such as a semiconductor wafer (which will be referred to as "wafer" hereinafter). Specifically, a resist coating process is performed such that a coating liquid or resist liquid is applied onto the wafer to form a resist film. Then, a pre-baking process (PAB) is performed such that the wafer treated by the coating process undergoes a heat process. Then, a light exposure process is performed such that the resist film undergoes light exposure in accordance with a predetermined pattern. Then, a post-exposure baking process (PEB) is performed such that a chemical reaction is promoted in the resist film treated by the light exposure. Then, a developing process is performed such that the resist film treated by the light exposure is developed.

After the photolithography sequence, an etching process is performed by use of the resist pattern as a mask to etch an underlying film, such as oxide film, thereby forming a predetermined pattern.

Incidentally, a coating/developing apparatus used in recent years for executing such a photolithography sequence includes a plurality of modules for performing the same process, such as a baking or developing process, to increase the productivity. Similarly, an etching apparatus includes a plurality of chambers for performing the same etching.

With the arrangement described above, a plurality of wafers can be distributed to the equivalent modules and are processed in parallel, thereby improving the productivity.

However, such a coating/developing apparatus causes a problem in that, since modules for performing the same process have individual differences, some attributes of a resist pattern formed on wafers, such the line width (CD) and sidewall angle (SWA), are rendered uneven. For the same reason, the etching apparatus causes a problem in that some attributes, such as an etching bias, are rendered uneven.

In order to solve this problem, correcting means for removing fluctuations of pattern attributes is provided in each of the coating/developing apparatus and etching apparatus.

Jpn. Pat. Appln. KOKAI Publication No. 2007-110078 discloses a substrate processing system in which a correction value (offset value) for a heat process performed in a coating/developing apparatus is adjusted for a pattern attribute to approximate a target value.

In this respect, conventionally, a coating/developing apparatus is arranged to make a correction for a resist pattern attribute to approximate a predetermined value in all the modules. Further, an etching apparatus is arranged to make a correction for an attribute, such as an etching bias, to approximate a predetermined value in all the chambers. However, mutual relativity between the coating/developing apparatus (modules) and etching apparatus (chambers) is not considered.

Consequently, some pattern attributes are rendered uneven among the combinations of the modules of the coating/developing apparatus and the chambers of the etching apparatus. Part of the unevenness or fluctuations cannot be removed by individual correction in each of the modules or chambers, depending on the combinations.

BRIEF SUMMARY OF THE INVENTION

An object of the present invention is to provide a substrate processing system and method for performing a resist pattern forming process and an etching process in this order on substrates, which can cause an attribute obtained on each substrate by the processes to approximate a target value and thereby increase the productivity.

According to a first aspect of the present invention, there is provided a substrate processing system comprising: a resist pattern forming apparatus including a plurality of modules each configured to perform a predetermined process on a substrate with an underlying film formed thereon, so as to form a resist pattern on the substrate by the process using the module; an etched pattern forming apparatus including a plurality of chambers each configured to accommodate a substrate with the resist pattern formed thereon, and to perform patterning of the underlying film by use of the resist pattern as a mask inside the chamber; examination devices configured to perform measurement and examination of a pattern attribute rendered on a substrate after a process in the resist pattern forming apparatus and a pattern attribute rendered on a substrate after a process in the etched pattern forming apparatus; and a controller configured to administrate measurement results of substrates obtained by the examination devices and transfer data for specifying modules and chambers used for processing the substrates, wherein the controller is preset to utilize the measurement results and the transfer data, so as to calculate correction value ranges respectively settable in the modules and the chambers and to determine combinations of the modules and the chambers such that corrections made within the correction value ranges cause a pattern attribute to approximate a predetermined value for each of the substrates.

The controller is preferably preset to determine correction values for processes in the modules and the chambers, in accordance with the determined combinations of the modules and the chambers.

According to this system, combinations of the modules and the chambers comprise transfer routes determined with reference to measurement results of attributes of formed patterns. Further, correction values are determined for the modules and the chambers with reference to the transfer routes. Consequently, each of the processed substrates can be provided with a pattern having an attribute approximating a predetermined target value.

In determining the combinations of the modules and the chambers, the controller is preferably preset to select combinations to increase the number of substrates processed per unit time.

This system can cause a pattern attribute to be essentially uniform and increase the productivity.

The system preferably includes one or more resist pattern forming apparatuses and one or more etched pattern forming apparatuses, and the controller is preferably preset to determine combinations between all modules disposed in the one or more resist pattern forming apparatuses and all chambers disposed in the one or more etched pattern forming apparatuses This system can cause the pattern attribute to be more uniform because of an increased number of choices for determining combinations of the module and the chamber, and can increase the productivity because of improved process efficiency for the substrates.

The examination devices are preferably respectively disposed in the resist pattern forming apparatuses and the etched pattern forming apparatuses.

According to this system, measurement and examination can be performed on substrates immediately after processes are finished respectively in the resist pattern forming apparatuses and the etched pattern forming apparatuses, so that the substrates is prevented from being detained, thereby increasing the productivity.

According to the second aspect of the present invention, there is provided a substrate processing method comprising: processing substrates by modules each configured to perform a predetermined process on a substrate with an underlying film formed thereon, thereby forming a resist pattern on the substrates; placing inside chambers the substrates with the resist pattern formed thereon, and performing an etching process on the underlying film by use of the resist pattern as a mask; performing measurement and examination of a pattern attribute rendered on the substrates after the resist pattern formation and a pattern attribute rendered on the substrates after the etching process; and utilizing measurement results of the substrates thus obtained and transfer data for specifying modules and chambers, from a plurality of modules and a plurality of chambers, used for processing the substrates, so as to calculate correction value ranges respectively settable in the modules and the chambers and to determine combinations of the modules and the chambers such that corrections made within the correction value ranges cause a pattern attribute to approximate a predetermined value for each of the substrates.

The method preferably comprises determining correction values for processes in the modules and the chambers, in accordance with the determined combinations of the modules and the chambers.

According to this method, combinations of the modules and the chambers comprise transfer routes determined with reference to measurement results of attributes of formed patterns. Further, correction values are determined for the modules and the chambers with reference to the transfer routes. Consequently, each of the processed substrates can be provided with a pattern having an attribute approximating a predetermined target value.

In determining the combinations of the modules and the chambers, the method preferably comprises selecting combinations to increase the number of substrates processed per unit time.

This method can cause a pattern attribute to be essentially uniform and increase the productivity.

In the first and second aspects, the plurality of modules typically comprise a set of modules configured to perform essentially the same resist process but having individual differences, and the plurality of chambers comprise a set of chambers configured to perform essentially the same etching process but having individual differences. For example, the set of modules is selected from the group consisting of a set of modules for coating, a set of modules for development, a set of modules for baking, a set of modules for hydrophobic process, and a set of modules for temperature adjusting.

In the first and second aspects, the system or method may comprise processing a plurality of substrates in the set of modules in parallel with each other with time lags therebetween, and processing a plurality of substrates in the set of chambers in parallel with each other with time lags therebetween. The system or method may comprise determining combinations of the modules and the chambers to be used in a subsequent pattern forming process such that a pattern attribute of the underlying film rendered on each of the substrates is within predetermined permissible limits, and administrating the transfer data with reference to these combinations. The system or method may comprise sequentially executing first patterning and second patterning on each of the substrates, such that the first patterning comprises forming a resist pattern and performing an etching process on the underlying film in this order, and the second patterning comprises forming a resist pattern and performing an etching process on the underlying film in this order.

Additional objects and advantages of the invention will be set forth in the description which follows, and in part will be obvious from the description, or may be learned by practice of the invention. The objects and advantages of the invention may be realized and acquired by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 7A to 7C are views showing a second pattern formation process in the substrate processing system shown in FIG. 1; and FIG. 8 is a diagram showing combinations of modules and chambers which allow a pattern attribute rendered after the etching process to be a target value (a value within predetermined permissible limits).

DETAILED DESCRIPTION OF THE INVENTION

Figure 1:
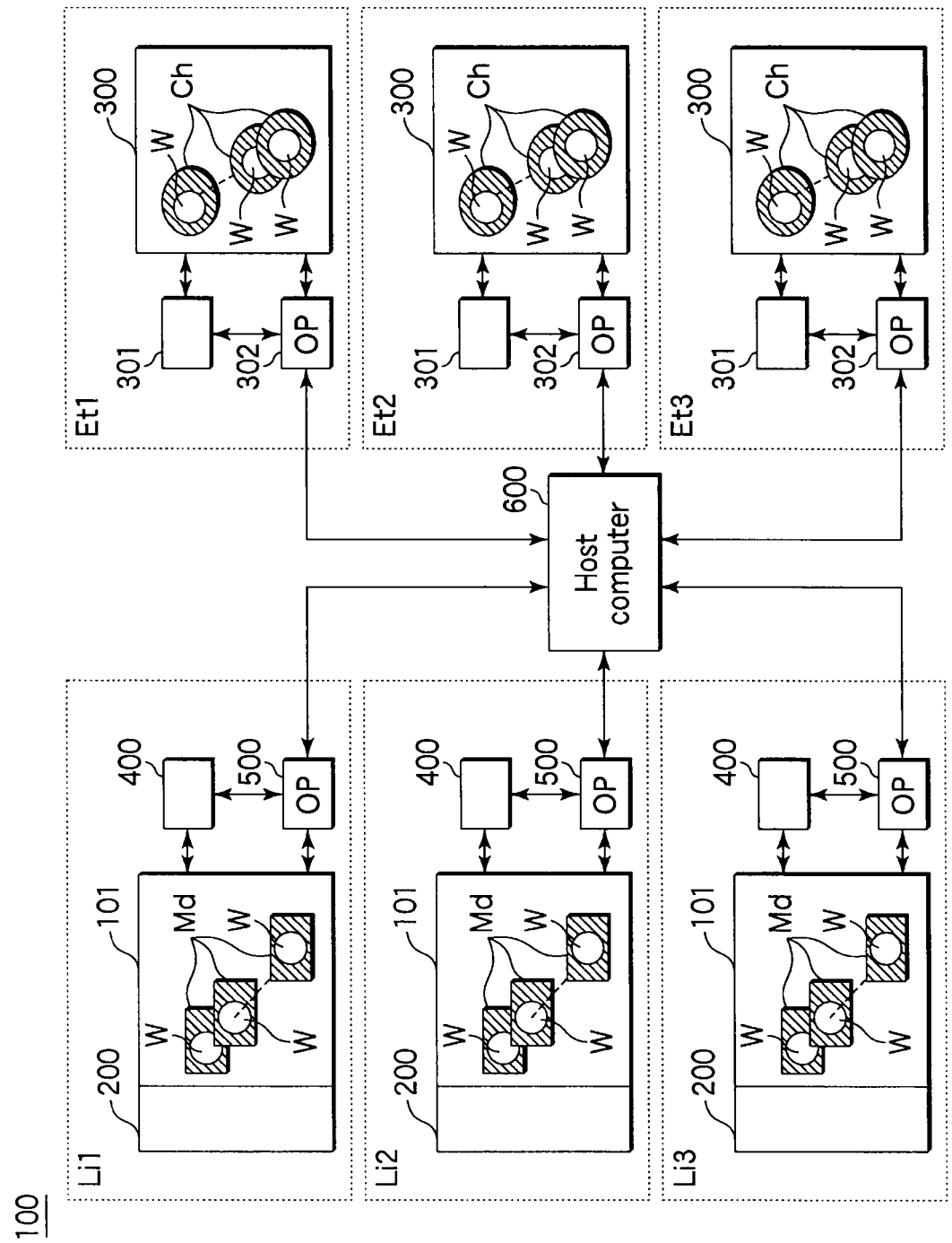
FIG. 1 is a block diagram conceptually and schematically showing the structure of a substrate processing system according to an embodiment of the present invention.

A substrate processing system and method according to an embodiment of the present invention will now be described with reference to the accompanying drawings. FIG. 1 is a block diagram conceptually and schematically showing the structure of a substrate processing system 100 according to an embodiment of the present invention.

As shown in FIG. 1, the substrate processing system 100 includes a plurality of (three in this embodiment) resist pattern forming apparatuses Li1 to Li3 each for forming a predetermined resist pattern on a target substrate or semiconductor wafer W (which will be simply referred to as "wafer W").

The substrate processing system 100 also includes a plurality of (three in this embodiment) etched pattern forming apparatuses Et1 to Et3 each for forming a pattern of a process target film by performing an etching process on a wafer W having a resist pattern formed thereon by one of the resist pattern forming apparatuses Li1 to Li3.

Further, the substrate processing system 100 includes a host computer 600 (controller) arranged to control the entire operation of an apparatus group including the resist pattern forming apparatuses Li1 to Li3 and etched pattern forming apparatuses Et1 to Et3, and to administrate data transmitted from these apparatuses.

It should be noted that this embodiment includes the three resist pattern forming apparatuses Li1 to Li3 and three etched pattern forming apparatuses Et1 to Et3, but the number of apparatuses is not limited to this example.

In each of the resist pattern forming apparatuses Li1 to Li3, a coating/developing apparatus 101 is disposed to perform resist liquid coating, heating, and developing processes on a wafer W, and a light exposure apparatus 200 for performing a light exposure process on a wafer W. Further, an examination apparatus 400 (examination device) is disposed to perform measurement and examination on a resist pattern formed by a photolithography sequence in terms of, e.g., the line width (CD) and sidewall angle (SWA). Further, the control section (OP) 500 consisting of a multi-purpose computer including an operation part (CPU) and a storage part (memory) is disposed to administrate measurement results obtained by the examination apparatus 400.

In each of the etched pattern forming apparatuses Et1 to Et3, an etching apparatus 300 is disposed to perform an etching process on a wafer W with a resist pattern formed thereon. Further, an examination apparatus 301 (examination device) is disposed to perform examination on a thin film pattern formed by an etching process in terms of, e.g., the etching bias. Further, the control section (OP) 302 consisting of a multi-purpose computer is disposed to administrate measurement results obtained by the examination apparatus 301.

Figure 2:
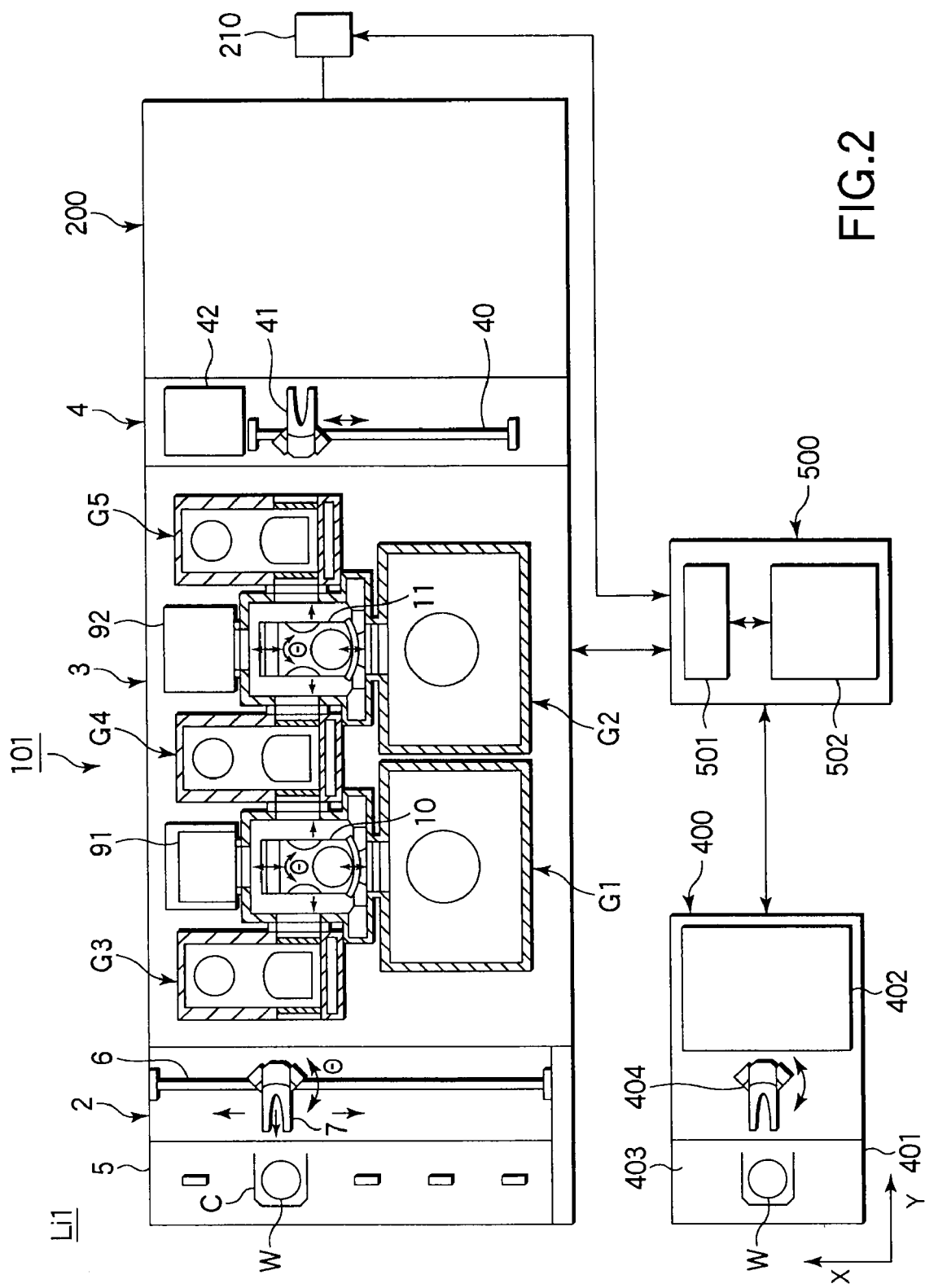
FIG. 2 is a plan view schematically showing the structure of a resist pattern forming apparatus disposed in the substrate processing system shown in FIG. 1.

Next, an explanation will be given of the structure of the resist pattern forming apparatus. Since the respective apparatuses Li1 to Li3 are equivalent in structure, the resist pattern forming apparatus Li1 will be explained as a representative. FIG. 2 is a plan view schematically showing the structure of the resist pattern forming apparatus Li1. As shown in FIG. 2, the resist pattern forming apparatus Li1 includes a coating/developing apparatus 101 used for performing resist liquid coating, heating, and developing processes on a target substrate or semiconductor wafer W.

Figure 3:
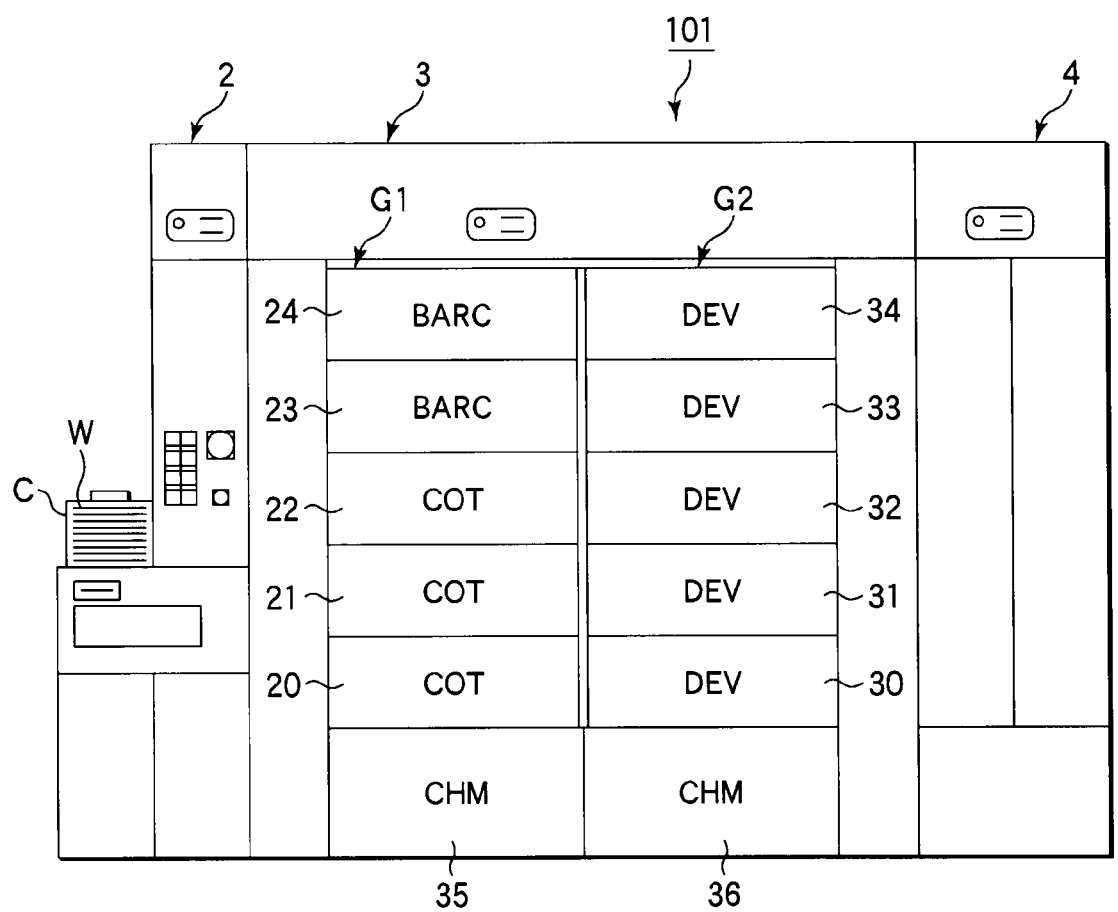
FIG. 3 is a front view of the coating/developing apparatus shown in FIG. 2.
Figure 4:
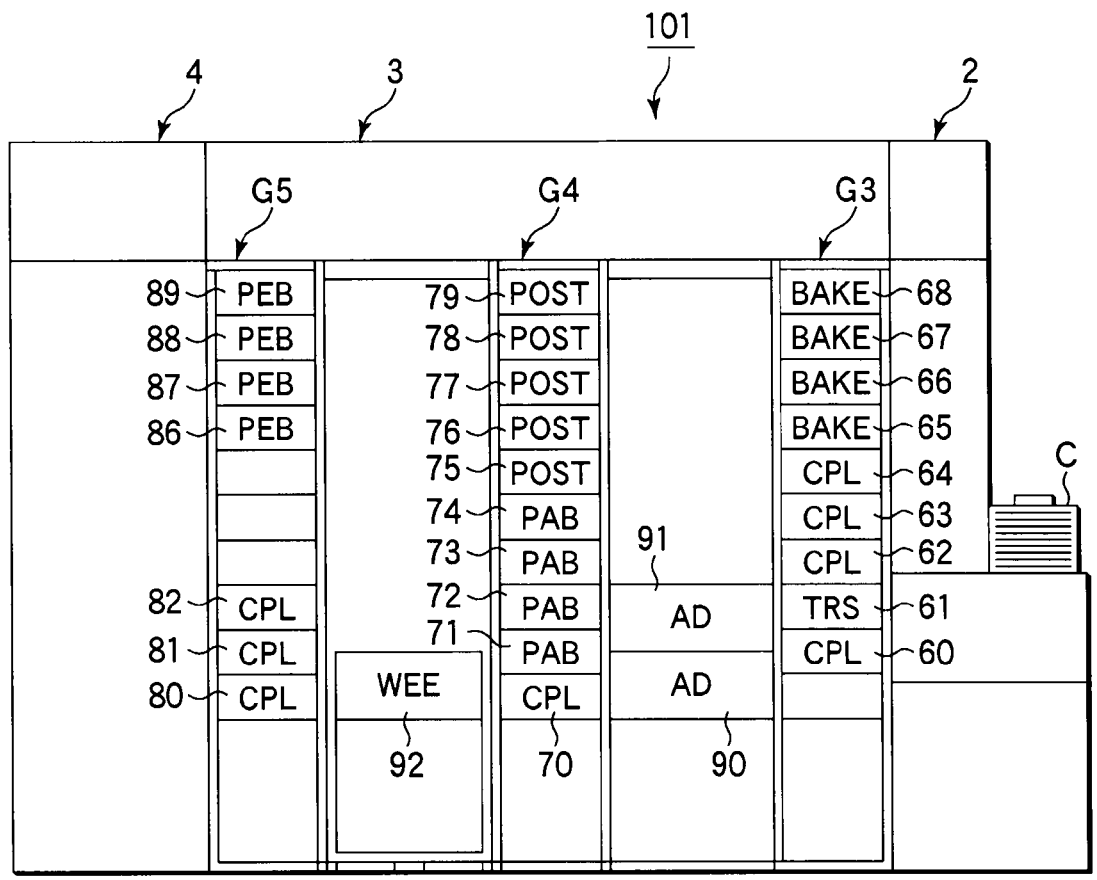
FIG. 4 is a back view of the coating/developing apparatus shown in FIG. 2.

FIG. 3 is a front view of the coating/developing apparatus 101 shown in FIG. 2. FIG. 4 is a back view of the coating/developing apparatus 101 shown in FIG. 2.

As shown in FIG. 2, the coating/developing apparatus 101 includes a cassette station 2, a process station 3, and an interface section 4 integratedly connected to each other. The cassette station 2 is used such that wafer cassettes, each storing, e.g., 25 wafers W, are transferred to and from external systems therethrough, and wafers W are transferred to and from cassettes C placed thereon. The process station 3 comprises a plurality of processing units stacked one on the other and configured to perform predetermined processes on wafers one by one in a photolithography sequence. The interface section 4 is disposed adjacent to the process station 3 and configured to transfer wafers W to and from the light exposure apparatus 200.

The cassette station 2 includes a cassette table 5, on which a plurality of cassettes C can be placed in a row in an X-direction (the vertical direction in FIG. 2). The cassette station 2 is provided with a wafer transfer member 7 movable on a guide rail 6 in the X-direction. The wafer transfer member 7 is also movable in the array direction of wafers W stored in each cassette C (Z-direction or vertical direction), so that it can selectively access the wafers W in the cassettes arrayed in the X-direction.

Further, the wafer transfer member 7 is rotatable in a θ-direction about the Z axis, so that it can access a temperature adjusting unit 60 and a transit unit 61 disposed in a third processing unit group G3 inside the process station 3, as described later.

The process station 3 adjacent to the cassette station 2 includes, e.g., five processing unit groups G1 to G5 each comprising a plurality of processing units stacked one on the other.

Specifically, as shown on the lower side of FIG. 2, the process station 3 includes a first processing unit group G1 and a second processing unit group G2 arrayed in this order from the cassette station 2. Further, as shown on the upper side of FIG. 2, the process station 3 includes a third processing unit group G3, a fourth processing unit group G4, and a fifth processing unit group G5 arrayed in this order from the cassette station 2.

A first transfer unit 10 is disposed between the third processing unit group G3 and fourth processing unit group G4. The first transfer unit 10 can selectively access the processing units in the first processing unit group G1, third processing unit group G3, and fourth processing unit group G4 to transfer wafers W to and from these units.

A second transfer unit 11 is disposed between the fourth processing unit group G4 and fifth processing unit group G5. The second transfer unit 11 can selectively access the processing units in the second processing unit group G2 and fifth processing unit group G5 to transfer wafers W to and from these units.

As shown in FIG. 3, the first processing unit group G1 includes five liquid processing units stacked one on the other, each for performing a process on a wafer W while supplying a predetermined liquid thereon. These units are formed of, e.g., resist coating units (COT) 20, 21, and 22 each for applying a resist liquid onto a wafer W and bottom coating units (BARC) 23 and 24 each for forming an anti-reflective coating that prevents reflection of light during a light exposure process, which are stacked in this order from below.

The second processing unit group G2 includes five liquid processing units stacked one on the other, which are formed of, e.g., developing units (DEV) 30 to 34 stacked in this order from below, each for performing a developing process on a wafer W while supplying a developing liquid thereon.

Further, chemical chambers (CHM) 35 and 36 are respectively disposed below the first processing unit group G1 and second processing unit group G2 and are used for supplying various process liquids to the liquid processing units located in the processing unit groups G1 and G2.

As shown in FIG. 4, the third processing unit group G3 includes nine processing units stacked one on the other. These units are formed of, e.g., a temperature adjusting unit (TCP) 60, a transit unit (TRS) 61 through which wafers W are transferred, high-precision temperature adjusting units (CPL) 62 to 64 each for adjusting the temperature of a wafer W by temperature control with high precision, and high-temperature heat processing units (BAKE) 65 to 68 each for performing a heat process on a wafer W at a high temperature, which are stacked in this order from below.

The fourth processing unit group G4 includes ten processing units stacked one on the other. These units are formed of, e.g., a high-precision temperature adjusting unit (CPL) 70, pre-baking units (PAB/first heat processing units) 71 to 74 each for performing a heat process (first heat process) on a wafer W after a resist coating process, and post-baking units (POST) 75 to 79 each for performing a heat process on a wafer W after a developing process, which are stacked in this order from below.

The fifth processing unit group G5 includes ten heat processing units stacked one on the other, each for performing a heat process on a wafer W. These units are formed of, e.g., high-precision temperature adjusting units (CPL) 80 to 82 and so forth, and post-exposure baking units (PEB/second heat processing units) 86 to 89 each for performing a heat process (second heat process) on a wafer W after light exposure, which are stacked in this order from below.

A plurality of, such as two, processing units are disposed on the forward side of the first transfer unit 10 in the X-direction. As shown in FIG. 4, these units are formed of, e.g., adhesion units (AD) 90 and 91 each for performing a hydrophobic process on a wafer W, which are stacked in this order from below.

A periphery light exposure unit (WEE) 92 is disposed on the forward side of the second transfer unit 11 in the X-direction, for performing light exposure selectively only on the edge portion of a wafer W, for example.

Each of the heat processing units, such as the pre-baking units (PAB) 71 to 74 and post-exposure baking units (PEB) 86 to 89, includes a heating plate for heating a wafer.

As shown in FIG. 2, the interface section 4 includes a wafer transfer member 41 movable on a guide rail 40 extending in the X-direction, and a buffer cassette 42. The wafer transfer member 41 is movable in the Z-direction and rotatable in a θ-direction, so that it can access the light exposure apparatus 200 adjacent to the interface section 4, buffer cassette 42, and fifth processing unit group G5 to transfer wafers W to and from these portions.

The light exposure apparatus 200 is configured to irradiate a wafer W having a resist liquid applied thereon with predetermined light rays from a light exposure section (not shown) through a predetermined mask pattern. The light exposure section includes a light source, a lens, an optical fiber, and so forth.

Light exposure conditions used in the light exposure apparatus 200 are determined by the light exposure intensity, light exposure time, light exposure focus (focus), and light exposure alignment position. These parameters are controlled by a controller 210 for controlling the light exposure apparatus 200 as a whole, in accordance with instructions from the control section 500.

The examination apparatus 400 comprises a cassette station 401 including a cassette table 403, an examination station 402, and a transfer unit 404. The control section (OP) 500 consisting of a multi-purpose computer including an operation part (CPU) 501 and a storage part (memory) 502.

In each of the resist pattern forming apparatuses Li1 to Li3, the coating/developing apparatus 101 and light exposure apparatus 200 structured as described above are used to form a resist pattern on a wafer W. Then, the examination apparatus 400 is used to perform measurement on the pattern in terms of the line width (CD) and sidewall angle (SWA), and the control section 500 administrates the measurement results thus obtained.

The control section 500 of each of the resist pattern forming apparatuses Li1 to Li3 is connected to the host computer 600, and is configured to supply the host computer 600 with the measurement results of the wafer W obtained in the corresponding one of the forming apparatuses Li1 to Li3 and a wafer ID for identifying the wafer W. The host computer 600 uses the wafer ID not only as information for identifying the wafer W but also as information for obtaining transfer data for identifying which module has been used for processing the wafer W.

Next, an explanation will be given of the structure of the etched pattern forming apparatuses Et1 to Et3 each for performing an etching process on a wafer W with a resist pattern formed thereon. Since the respective apparatuses Et1 to Et3 are equivalent in structure, the etched pattern forming apparatus Et1 will be explained as a representative.

As shown in FIG. 1, the etched pattern forming apparatus Et1 includes an etching apparatus 300. The etching apparatus 300 is used for performing an etching process on a wafer W processed by the photolithography sequence by use of the coating/developing apparatus 101 and light exposure apparatus 200. In the etching process, a resist pattern formed on the wafer W is used as a mask to etch an underlying film, such as an Si oxide film, disposed on the wafer W.

For example, the etching apparatus 300 is formed of an apparatus of the parallel-plate plasma generation type. In operation, plasma is generated inside a chamber Ch with a wafer W placed therein to turn a predetermined etching gas into plasma, so that a predetermined plasma process is performed on the wafer W.

Etching conditions used in the etching apparatus 300 are determined by the etching time and the composition ratio of the etching gas. The etching time is defined by a time period in which the etching gas is supplied onto the wafer W. The composition ratio of the etching gas is determined depending on the type and volume of the etching gas.

Further, as described above, the etched pattern forming apparatus Et1 includes the examination apparatus 301 for performing examination on a thin film pattern formed by the etching process in terms of, e.g., the etching bias, and the control section 302 consisting of a multi-purpose computer for administrating measurement results obtained by the examination apparatus 301.

The control section 302 of each of the etched pattern forming apparatuses Et1 to Et3 is connected to the host computer 600, and is configured to supply the host computer 600 with the measurement results obtained in the corresponding one of the forming apparatuses Et1 to Et3 and a wafer ID. The host computer 600 uses the wafer ID not only as information for identifying the wafer W but also as information for obtaining transfer data for identifying which chamber has been used for processing the wafer W.

The host computer 600 includes an operation part 601 and a storage part 602. The measurement results of patterns on wafers W, data concerning time periods used for patterning, and so forth are supplied from the resist pattern forming apparatuses Li1 to Li3 and etched pattern forming apparatuses Et1 to Et3 and are stored in the storage part 602. The operation part 601 uses the data thus stored to determine optimum combinations of the modules Md of the resist pattern forming apparatuses Li1 to Li3 and the chambers Ch of the etched pattern forming apparatuses Et1 to Et3.

In this embodiment, the modules Md to be selected form a group of modules configured to perform essentially the same resist process but having individual differences. For example, each set of the resist coating processing units (COT), bottom coating units (BARC), developing processing units (DEV), temperature adjusting units (CPL), pre-baking units (PAB), post-baking units (POST), post-exposure baking units (PEB), and adhesion units (AD) described above is formed of a plurality of units designed by the same specifications. Similarly, the chambers Ch to be selected form a group of chambers configured to perform essentially the same etching process but having individual differences.

Specifically, for all the wafers W to undergo a patterning process, transfer routes are determined as algorithm (transfer algorithm), so that fluctuations due to combinations of the modules Md of the resist pattern forming apparatuses Li1 to Li3 and the chambers Ch of the etched pattern forming apparatuses Et1 to Et3 are removed, and the productivity (the number of wafers processed per unit time) is improved.

In every pattern forming process, a wafer W is transferred in accordance with transfer algorithm obtained in the last pattern forming process.

Figure 5:
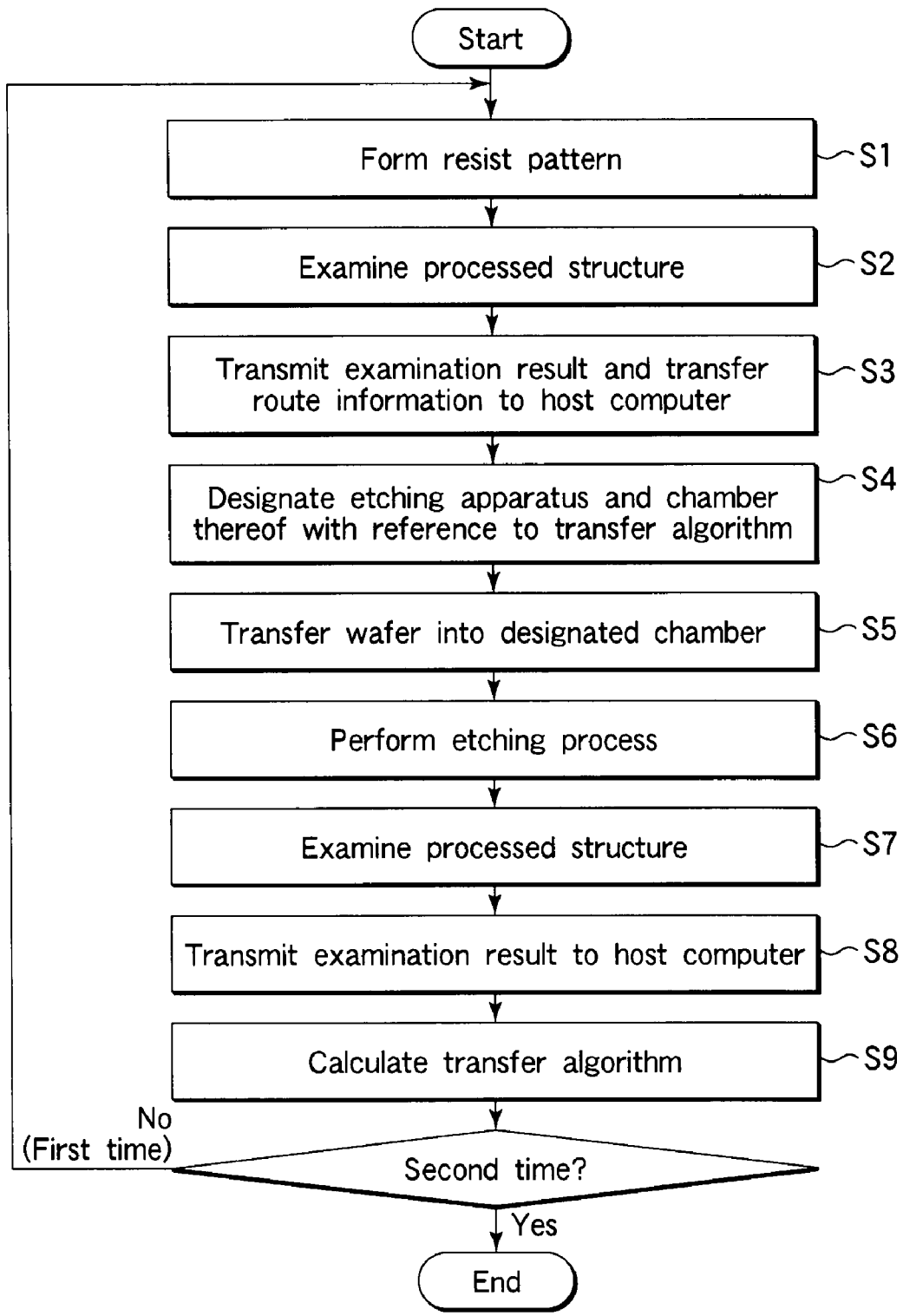
FIG. 5 is a flow chart showing a flow of a pattern forming process performed in the substrate processing system shown in FIG. 1.

Next, an explanation will be given of a pattern forming process performed, on a process target film disposed on the wafer W, in the substrate processing system 100 described above. FIG. 5 is a flow chart showing a flow of a pattern forming process performed in the substrate processing system 100.

Figure 6A:
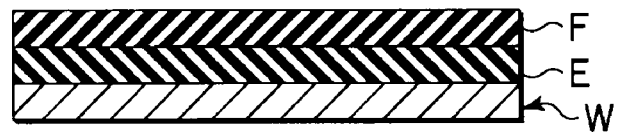
FIGS. 6A to 6D are views showing a first pattern formation process in the substrate processing system shown in FIG. 1.

For example, as shown in FIG. 6A, a lower film E, such as an organic lower film, is formed on the surface of a wafer W, and an SOG (Spin On Glass) film F is formed as a process target film on the lower film E, in advance. In this embodiment, the SOG film F undergoes patterning twice in total.

This method performed by use of patterning twice in total is called double patterning, which is a technique effective in forming a minute pattern of, e.g., 32-nm or 45-nm level that is technically difficult to form only by shortening the wavelength of light rays in a light exposure process.

For example, according to a method of the double patterning type, formation of a first resist film, light exposure, and development are sequentially performed to form a first pattern in the resist film and a developable material layer (SOG film) therebelow. Then, an etching process is performed to remove the resist film with the first pattern. Then, formation of a second resist film, light exposure, and development are sequentially performed to form a second pattern in the resist film and the developable material layer (SOG film) therebelow. Consequently, a minute pattern is realized by synthesizing the first patterning and second patterning.

Specifically, at first, the first patterning is started in the coating/developing apparatus 101 of, e.g., the resist pattern forming apparatus Li1 (step S1 in FIG. 5). In this first patterning, transfer routes among modules for performing processes are determined in accordance with transfer algorithm obtained with reference to patterning results until the last time.

Figure 6B:
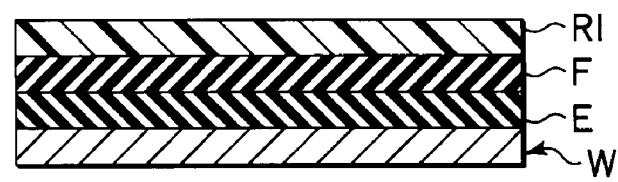

In the coating/developing apparatus 101, wafers W in a cassette C shown in FIG. 2 are taken out one by one by the wafer transfer member 7. A wafer W thus taken out is transferred into the temperature adjusting unit 60 of the third processing unit group G3 in the process station 3. After temperature adjustment in the temperature adjusting unit 60, the wafer W is transferred by the first transfer unit 10 into, e.g., the resist coating unit 20. In the resist coating unit 20, a resist liquid is applied onto the surface of the wafer W to form a first resist film R1, as shown in FIG. 6B.

The wafer W with the first resist film R1 formed thereon is transferred by the first transfer unit 10 into, e.g., the pre-baking unit 71, in which the wafer W undergoes pre-baking. Then, the wafer W is transferred by the second transfer unit 11 sequentially into the periphery light exposure unit 92 and temperature adjusting unit 82, in which the wafer W undergoes predetermined processes. Then, the wafer W is transferred by the wafer transfer member 41 of the interface section 4 into the light exposure apparatus 200, in which the resist film R1 on the wafer W undergoes light exposure in accordance with a predetermined pattern. After the light exposure process, the wafer W is transferred by the wafer transfer member 41 into, e.g., the post-exposure baking unit 86 of the process station 3. In the post-exposure baking unit 86, the wafer W is heated on the heating plate for a predetermined time.

Figure 6C:
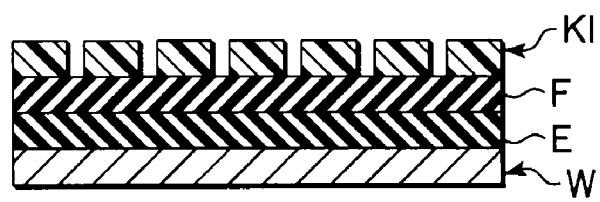

After the post-exposure baking, the wafer W is transferred by the second transfer unit 11 into, e.g., the temperature adjusting unit 70, in which the wafer W undergoes temperature adjustment. Then, the wafer W is transferred into the developing unit 30, in which the resist film R1 on the wafer W undergoes development to form a resist pattern K1 on the wafer W, as shown in FIG. 6C. Then, the wafer W is transferred by the wafer transfer member 7 back into the cassette C on the cassette station 2.

The wafer W returned into the cassette C is then transferred by a transfer mechanism (not shown) into the examination apparatus 400, in which the pattern formed on the wafer W undergoes measurement in terms of, e.g., the line width (CD) and sidewall angle (SWA) (step S2 in FIG. 5).

The measurement results of pattern attributes obtained by the examination apparatus 400 are transmitted along with a wafer ID to the control section 500. These units of data are further transmitted from the control section 500 to the host computer 600 (step S3 in FIG. 5).

Then, the host computer 600 designates an etched pattern forming apparatus Et and a chamber Ch thereof, with reference to the transfer algorithm, to perform a subsequent etching process (step S4 in FIG. 5).

After the measurement in the examination apparatus 400, the wafer W is transferred by a transfer unit (not shown) to the designated etched pattern forming apparatus Et (for example, the etched pattern forming apparatus Et2) and further into a predetermined chamber Ch of the etching apparatus 300 thereof (step S5 in FIG. 5).

Figure 6D:
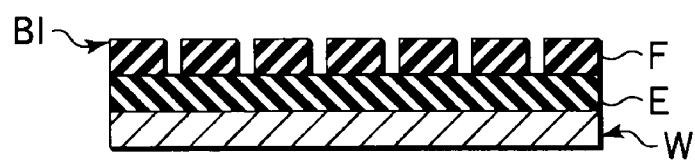

In the etched pattern forming apparatus Et2, the SOG film F formed as a process target film on the wafer W undergoes etching performed by use of the resist pattern K1 as a mask in the etching apparatus 300. Then, the unnecessary resist pattern K1 is removed by a resist removing unit (not shown). The first patterning is thereby finished, so that a pattern B1 is formed in the SOG film F on the wafer W, as shown in FIG. 6D (step S6 in FIG. 5).

After the pattern B1 is formed by the etching process, the wafer W is transferred by a transfer mechanism (not shown) into the examination apparatus 301, in which the wafer W undergoes measurement and examination in terms of attributes of the pattern B1, such as the etching bias (step S7 in FIG. 5).

The measurement results of pattern attributes obtained by the examination apparatus 301 are transmitted to the control section 302. These units of data are further transmitted from the control section 302 to the host computer 600 (step S8 in FIG. 5).

Then, the host computer 600 calculates correction (offset) values used for the modules Md and chambers Ch of the pattern forming apparatuses Li1 to Li3 and Et1 to Et3, with reference to the measurement results of pattern attributes on the wafer W rendered after the resist pattern forming process and after the etching process.

Specifically, with reference to the measurement results obtained after the processes performed in the modules Md and chambers Ch of the pattern forming apparatuses Li1 to Li3 and Et1 to Et3, correction (offset) value ranges settable in the modules Md and chambers Ch are first determined.

Then, in consideration of the correction value ranges, combinations of the modules Md and chambers Ch are determined such that corrections made for the modules Md and chambers Ch can cause the pattern attributes rendered after the etching process to be predetermined values (target values) for all the wafers W. Further, correction values used for the modules Md and chambers Ch according to the combinations thus determined are further determined.

The correction (offset) values thus determined for the modules Md and chambers Ch are transmitted to the corresponding control sections (OP) 500 and control sections (OP) 302 of the pattern forming apparatuses, and are used as parameters for the subsequent module processes and chamber processes.

Further, with reference to the combinations described above, transfer routes of the wafers W (transfer algorithm) are determined, such that the algorithm is constructed to increase the productivity (the number of wafers processed per unit time) as far as possible (step S9 in FIG. 5). The algorithm thus determined is used in the subsequent pattern forming process.

Next, an explanation will be give of algorithm calculation to increase the productivity.

For example, it is assumed that the modules Md of a resist pattern forming apparatus are formed of four modules Md1 to Md4 and the chambers Ch of an etched pattern forming apparatus are formed of three chambers Ch1 to Ch3.

FIG. 8 is a diagram showing combinations of the modules Md and chambers Ch which allow a pattern attribute rendered after the etching process to be a target value (a value within predetermined permissible limits). In FIG. 8, the symbol "○" denotes that a combination of Md and Ch is acceptable, while the symbol "x" denotes that a combination of Md and Ch is unacceptable (corrections cannot cause the pattern attribute to be within a range of a predetermined value (target value), i.e., within predetermined permissible limits). Specifically, the module Md1 can be combined with the chamber Ch1, Ch2, or Ch3, the module Md2 can be combined with the chamber Ch1 or Ch2, the module Md3 can be combined with the chamber Ch3, and the module Md4 can be combined with the chamber Ch1 or Ch3. In this case, it is determined to combine the module Md1 with the chamber Ch1, the module Md2 with the chamber Ch2, the module Md3 with the chamber Ch3, and the module Md4 with the chamber Ch1, in order to improve the number of wafers processed per unit time.

Specifically, where a plurality of wafers W are processed, the resist pattern forming apparatus is operated such that the first wafer W1 is transferred to and processed in the module Md1, the second wafer W2 is transferred to and processed in the module Md2 with a time lag relative to the first wafer W1, the third wafer W3 is transferred to and processed in the module Md3 with a time lag relative to the second wafer W2, and the fourth wafer W4 is transferred to and processed in the module Md4 with a time lag relative to the third wafer W3.

Then, the etched pattern forming apparatus is operated to handle these wafers W1 to W4 such that the first wafer W1 is transferred to and processed in the chamber Ch1, the second wafer W2 is transferred to and processed in the chamber Ch2 with a time lag relative to the first wafer W1, and the third wafer W3 is transferred to and processed in the chamber Ch3 with a time lag relative to the second wafer W2. Further, the process on the wafer W1 in the chamber Ch1 has been finished at the timing when the fourth wafer W4 needs to be transferred to the chamber, so unloading of the wafer W1 and loading of the wafer W4 can be performed at the same time.

In this case, since the first wafer W1 is processed in the module Md1, the chamber Ch1, Ch2, or Ch3 can be selected as a chamber to be combined therewith to cause the pattern attribute rendered after the etching process to be a predetermined value (target value). However, if a chamber other than the chamber Ch1 is selected, the second and third wafers cannot be transferred to chambers without a transfer waiting time, thereby resulting in a decrease in the number of wafers processed per unit time.

After the first patterning is finished and the algorithm is determined as described above, the wafers W are stored in, e.g., the cassette C again, and the second patterning is started (step S1 in FIG. 5). In the second patterning, each wafer W is first transferred by the wafer transfer member 7 into the process station 3, as in the first patterning.

In the second patterning, transfer routes among modules for performing processes are determined in accordance with transfer algorithm obtained with reference to results of the last patterning, i.e., the first patterning.

In accordance with the transfer algorithm, the wafer W is transferred into, e.g., the resist coating unit 21 of the resist pattern forming apparatus Li1, in which a second resist film R2 is formed on the SOG film F on the wafer W, as shown in FIG. 7A. Then, in accordance with the transfer algorithm, the wafer W is transferred sequentially into, e.g., the pre-baking unit 72 and light exposure apparatus 200. In the light exposure apparatus 200, the resist film R2 on the wafer W undergoes light exposure in accordance with a predetermined pattern.

After the light exposure process, the wafer W is transferred by the wafer transfer member 41 into, e.g., the post-exposure baking unit 86, in which the wafer W undergoes second post-exposure baking.

After the post-exposure baking, the wafer W is transferred, in accordance with the transfer algorithm, sequentially into, e.g., the developing unit 31 and post-baking unit 76 to form a second resist pattern K2, as shown in FIG. 7B.

Thereafter, the wafer W is transferred back into the cassette C on the cassette station 2. Then, the wafer W is transferred by a transfer mechanism (not shown) into the examination apparatus 400, in which the resist pattern K2 formed on the wafer W undergoes measurement in terms of, e.g., the line width (CD) and sidewall angle (SWA) (step S2 in FIG. 5).

The measurement results concerning the resist pattern K2 obtained by the examination apparatus 400 are transmitted along with transfer data for processing the wafer W to the control section 500. These units of data are further transmitted from the control section 500 to the host computer 600 (step S3 in FIG. 5).

Then, the host computer 600 designates an etched pattern forming apparatus Et and a chamber Ch thereof, with reference to the transfer algorithm, to perform a subsequent etching process (step S4 in FIG. 5).

After the measurement in the examination apparatus 400, the wafer W is transferred by a transfer unit (not shown) to the designated etched pattern forming apparatus Et (for example, the etched pattern forming apparatus Et1) and further into a predetermined chamber Ch of the etching apparatus 300 thereof (step S5 in FIG. 5).

In the etched pattern forming apparatus Et1, the SOG film F formed as a process target film on the wafer W undergoes etching performed by use of the resist pattern K2 as a mask in the etching apparatus 300. Then, the unnecessary resist pattern K2 is removed by a resist removing unit (not shown). The second patterning is thereby finished, so that a final pattern B2 is formed in the SOG film F on the wafer W, as shown in FIG. 7C (step S6 in FIG. 5).

After this thin film pattern is formed by the etching process, the wafer W is transferred by a transfer mechanism (not shown) into the examination apparatus 301, in which the wafer W undergoes measurement and examination in terms of attributes of the pattern B2, such as the etching bias (step S7 in FIG. 5). After the measurement in the examination apparatus 301, the wafer W is transferred back into the cassette C on the cassette station 2, so that the pattern forming process is finished. In this manner, wafers W sequentially undergo the processes and measurement.

The measurement results obtained by the examination apparatus 301 are transmitted to the control section 302. These units of data are further transmitted from the control section 302 to the host computer 600 (step S8 in FIG. 5).

Then, the host computer 600 calculates correction (offset) values used for the modules Md and chambers Ch of the pattern forming apparatuses Li1 to Li3 and Et1 to Et3, with reference to the measurement results of pattern attributes on the wafer W rendered after the resist pattern forming process and after the etching process, as performed after the first patterning.

The correction (offset) values thus determined for the modules Md and chambers Ch are transmitted to the corresponding control sections (OP) 500 and control sections (OP) 302 of the pattern forming apparatuses, and are used as parameters for the subsequent module processes and chamber processes.

Further, with reference to the combinations described above, transfer routes of the wafers W (transfer algorithm) are determined, such that the algorithm is constructed to increase the productivity (the number of wafers processed per unit time) as far as possible (step S9 in FIG. 5). The algorithm thus determined is used in the next pattern forming process.

As described above, according to the embodiment of the present invention, the pattern forming process is performed on wafers W through the resist pattern forming apparatuses Li1 to Li3 and etched pattern forming apparatuses Et1 to Et3, while the respective wafers W are transferred in accordance with transfer algorithm determined after the last pattern forming process.

The transfer algorithm comprises transfer routes determined, in consideration of combinations of components (modules Md) for the resist pattern forming process and components (chambers Ch) for the etched pattern forming process, with reference to measurement results of attributes of formed patterns. Further, process correction (offset) values are determined for the modules Md and chambers Ch with reference to the transfer routes.

In this case, unlike the conventional technique, fluctuations of pattern attributes are not caused due to combinations of components for the resist pattern forming process and components for the etched pattern forming process. Consequently, after the etching process, all the processed wafers W can be provided with patterns having attributes approximating predetermined target values.

With an increase in miniaturization level of patterns, fluctuations of pattern attributes may be easily caused due to combinations of components for the resist pattern forming process and components for the etched pattern forming process. Accordingly, the substrate processing system and method according to the embodiment of the present invention are effective particularly to a process using a double patterning method, as described above, for forming minute pattern of, e.g., 32-nm or 45-nm level.

Accordingly, the embodiment of the present invention provides a substrate processing system and method for performing a resist pattern forming process and an etching process in this order on substrates, which can cause an attribute obtained on each substrate by the processes to approximate a target value and thereby increase the productivity.

Incidentally, the embodiment described above is exemplified by a case where examination apparatuses are respectively connected to resist pattern forming apparatuses and etched pattern forming apparatuses, so as to communicate with them.

However, the structure of the substrate processing system is not limited to that described with reference to the embodiment. Specifically, even where examination apparatuses are not connected to resist pattern forming apparatuses and etched pattern forming apparatuses, the present invention can be realized while measurement results obtained by the examination apparatuses are input by an operator through data input devices of the forming apparatuses.

In the embodiment described above, the target substrate is exemplified by a semiconductor wafer. In place of a semiconductor wafer, the present invention may be applied to another substrate, such as an LCD substrate, CD substrate, glass substrate, photo-mask, or printed circuit board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method comprising:
    performing a resist process on a plurality of substrate each with an underlying film present thereon to form a resist pattern on the underlying film in a resist pattern forming apparatus, by processing the substrates respectively by a plurality of modules of the resist pattern forming apparatus, which are configured to perform a same process step but having individual differences;
    performing a first examination on the substrates to measure and examine a pattern attribute of the resist pattern;
    performing an etching process on the substrates to etch the underlying film by use of the resist pattern as a mask and thereby to form an etched pattern in a etched pattern forming apparatus, by processing the substrate respectively by a plurality of chambers of the etched pattern forming apparatus, which are configured to perform a same process step but having individual differences;
    removing the resist pattern from the substrates;
    performing a second examination on the substrates to measure and examine a pattern attribute of the etched pattern;
    checking, by a controller, measurement results obtained by a the first and second examinations and transfer data for specifying a relationship of the substrates with use of the modules and the chambers for processing the substrates in performing the resist process and the etching process;
    obtaining, by the controller, correction value ranges respectively settable in the modules and the chambers for the substrates by use of the measurement results and the transfer data;
    determining, by the controller, a plurality of acceptable combinations of a module and a chamber from the modules and the chambers, in view of the individual differences of the modules and the chambers, such that corrections to be made in each of the acceptable combinations within the correction value ranges cause a pattern attribute of the etched pattern to approximate a predetermined value for each of the substrates, and the controller determines that a respective combination of a module and a chamber from the modules and chambers to be unacceptable when corrections to be made the respective combinations do not cause the pattern attribute of the etched pattern to approximate a predetermined value for each of the substrates; and
    determining, by the controller, transfer routes of substrates each undergoing a subsequent performance of the resist process and the etching process from the plurality of acceptable combinations of a module and chamber.

2. The substrate processing method according to claim 1, wherein the method further comprises determining, by the controller, correction values to be used for the module and the chamber of each of the combinations, in accordance with the makeup of each of the combinations.

3. The substrate processing method according to claim 1, wherein the transfer routes are determined to increase the number of substrates processed per unit time.

4. The substrate processing method according to claim 1, wherein performing the resist process includes processing the substrates respectively by the modules in parallel with each other with time lags therebetween, and performing the etching process includes processing the substrates by the chambers in parallel with each other with time lags therebetween.

5. The substrate processing method according to claim 1, wherein the method further comprises administrating, by the controller, data for transferring substrates to be used in a subsequent pattern forming process with reference to the combinations.

6. The substrate processing method according to claim 1, wherein the method comprises sequentially executing first patterning and second patterning on each of the substrates, such that the first patterning includes forming a resist pattern and performing an etching process on the underlying film in this order, and the second patterning includes forming a resist pattern and performing an etching process on the underlying film in this order, and wherein the combinations of a module and a chamber are determined based on the first patterning and are then applied to the second patterning.

7. The substrate processing method according to claim 1, wherein the controller includes a portion configured to control an operation of the resist pattern forming apparatus and a portion configured to control an operation of the etched pattern forming apparatus.

8. The substrate processing method according to claim 1, wherein the first examination is performed by an examination device of the resist pattern forming apparatus, and the second examination is performed by an examination device of the etched pattern forming apparatus.

9. The substrate processing method according to claim 1, wherein the modules of the resist pattern forming apparatus include a set of modules selected from the group consisting of a set of modules for coating, a set of modules for development, a set of modules for baking, a set of modules for hydrophobic process, and a set of modules for temperature adjusting.

10. A substrate processing method comprising:
performing a first resist process on a plurality of substrate each with an underlying film present thereon to form a first resist pattern on the underlying film in a resist pattern forming apparatus, by processing the substrates respectively by a plurality of modules of the resist pattern forming apparatus, which are configured to perform a same process step but having individual differences;
performing a first examination on the substrates to measure and examine a pattern attribute of the resist pattern;
performing a first etching process on the substrates to etch the underlying film by use of the first resist pattern as a mask and thereby to form a first etched pattern in a etched pattern forming apparatus, by processing the substrate respectively by a plurality of chambers of the etched pattern forming apparatus, which are configured to perform a same process step but having individual differences;
removing the first resist pattern from the substrates;
performing a second examination on the substrates to measure and examine a pattern attribute of the first etched pattern;
checking, by a controller, measurement results obtained by a the first and second examinations and transfer data for specifying a relationship of the substrates with use of the modules and the chambers for processing the substrates in performing the first resist process and the first etching process;
obtaining, by the controller, correction value ranges respectively settable in the modules and the chambers for the substrates by use of the measurement results and the transfer data;
determining, by the controller, a plurality of acceptable combinations of a module and a chamber from the modules and the chambers, in view of the individual differences of the modules and the chambers, such that corrections to be made in each of the acceptable combinations within the correction value ranges cause a pattern attribute of the etched pattern to approximate a predetermined value for each of the substrates, and the controller determines that a respective combination of a module and a chamber from the modules and chambers to be unacceptable when corrections to be made the respective combinations do not cause the pattern attribute of the first etched pattern to approximate a predetermined value for each of the substrates;
performing a second resist process on the substrate to form a second resist pattern on the underlying film in the resist pattern forming apparatus; and
performing a second etching process on the substrates to etch the underlying film by use of the second resist pattern as a mask and thereby to form a second etched pattern in the etched pattern forming apparatus,
wherein transfer routes of the substrates each undergoing the second resist process and the second etching process are determined from the plurality of acceptable combinations of a module and chamber.

11. The substrate processing method according to claim 10, wherein the method further comprises administrating, by the controller, data for transferring the substrates to be used in performing the second resist process and the second etching process with reference to the combinations.

12. The substrate processing method according to claim 1, wherein the method further comprises determining, by the controller, correction values to be used for the module and the chamber of each of the combinations in performing the second resist process and the second etching process, in accordance with the makeup of each of the combinations.

13. The substrate processing method according to claim 10, wherein the transfer routes are determined to increase the number of substrates to be processed per unit time.

14. The substrate processing method according to claim 10, wherein each of performing the first resist process and performing the second resist process includes processing the substrates respectively by the modules in parallel with each other with time lags therebetween, and each of performing the first etching process and performing the second etching process includes processing the substrates by the chambers in parallel with each other with time lags therebetween.

15. The substrate processing method according to claim 10, wherein the controller includes a portion configured to control an operation of the resist pattern forming apparatus and a portion configured to control an operation of the etched pattern forming apparatus.

* * * * *